(12) United States Patent
Mulder et al.

(10) Patent No.: US 6,541,972 B2
(45) Date of Patent: Apr. 1, 2003

(54) MRI APPARATUS WITH GRADIENT CONTROL CONVERSION UNIT

(75) Inventors: Gerardus Bernardus Jozef Mulder, Eindhoven (NL); Gerardus Nerius Peeren, Eindhoven (NL); Paul Bernard Bunk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/739,510

(22) Filed: Dec. 18, 2000

(65) Prior Publication Data

US 2001/0024122 A1 Sep. 27, 2001

(30) Foreign Application Priority Data

Dec. 20, 1999 (EP) .............................. 99204403

(51) Int. Cl.[7] ................................. G01V 3/00
(52) U.S. Cl. ........................ 324/318; 324/322
(58) Field of Search ................. 324/318, 309, 324/307, 322, 320

(56) References Cited

U.S. PATENT DOCUMENTS

| | | | | |
|---|---|---|---|---|
| 4,695,802 A | * | 9/1987 | Zijlstra .................. | 324/319 |
| 4,959,613 A | | 9/1990 | Yamamoto et al. ........ | 324/318 |
| 4,998,064 A | * | 3/1991 | Fuderer et al. ............ | 324/309 |
| 5,068,786 A | * | 11/1991 | Netter et al. ............... | 324/309 |
| 5,079,503 A | * | 1/1992 | Siebold et al. ............. | 324/309 |
| 5,172,059 A | * | 12/1992 | den Boef ................... | 324/307 |
| 5,208,534 A | * | 5/1993 | Okamoto et al. ........... | 324/307 |
| 5,280,246 A | * | 1/1994 | Takahashi et al. .......... | 324/318 |
| 5,319,309 A | * | 6/1994 | den Boef et al. ........... | 324/309 |
| 5,359,289 A | * | 10/1994 | van der Meulen .......... | 324/320 |
| 5,414,359 A | * | 5/1995 | Mehlkopf et al. .......... | 324/309 |
| 5,481,192 A | * | 1/1996 | Mehlkopf et al. .......... | 324/318 |
| 5,552,708 A | * | 9/1996 | Ham .......................... | 324/318 |
| 5,554,929 A | | 9/1996 | Doty et al. ................. | 324/418 |
| 5,638,001 A | * | 6/1997 | Vrijheid et al. ............. | 324/318 |
| 5,708,359 A | * | 1/1998 | Gregory et al. ............. | 324/307 |
| 5,708,693 A | * | 1/1998 | Aach et al. ................. | 378/62 |
| 5,823,959 A | * | 10/1998 | Rasche ....................... | 600/410 |
| 5,987,348 A | * | 11/1999 | Fischer et al. .............. | 600/413 |
| 6,304,085 B2 | * | 10/2001 | Kuth et al. ................. | 324/318 |

* cited by examiner

*Primary Examiner*—Edward Lefkowitz
*Assistant Examiner*—Dixomara Vargas
(74) *Attorney, Agent, or Firm*—John Vodopia

(57) ABSTRACT

Gradient fields $G_x = \partial B_z/\partial x$ etc. are generated in an MRI apparatus in order to indicate the position (x, y, z) of an object pixel to be imaged. In a known MRI system the x and y gradient fields are generated by a combination of four gradient coils, two of which are intended to receive the x and y gradient signals whereas the other two coils are intended to receive a mix of the x and y gradient signals in order to enable a simpler structure of the gradient coils and easier impedance matching. According to the invention, apart from the x, y and z gradient signals, other signals are applied to a conversion system (35) in order to realize the desired gradient fields but also to achieve degrees of freedom that can be used for optimizing system parameters such as heat dissipation or the uniformity of the distribution of power among the gradient amplifiers.

10 Claims, 6 Drawing Sheets

MRI APPARATUS WITH GRADIENT CONTROL CONVERSION UNIT

The invention relates to a magnetic resonance apparatus which includes
- a gradient system for generating L gradient fields in a measuring volume of the apparatus, which gradient system includes a number of N (N>L) mutually independent channels, each of which consists of a gradient amplifier with a signal input and an output and a gradient coil connected to the output of the gradient amplifier, and
- a conversion unit
  - provided with N outputs which are connected to the N signal inputs of the N gradient amplifiers in a one-to-one association, and
  - provided with inputs, a number L of which is arranged to receive L gradient signals representing the gradient fields to be generated,
  - which conversion unit is arranged to convert, in conformity with a conversion algorithm stored in the conversion unit, at least the L gradient signals applied to the inputs into N control signals for controlling the N gradient amplifiers.

A magnetic resonance imaging (MRI) apparatus of this kind is known from U.S. Pat. No. 5,554,929. The gradient system in the known MRI apparatus is arranged to generate three gradient fields (so L=3) which, as is customary in this technique, form an x gradient field ($G_x = \partial B_z/\partial x$), a y gradient field ($G_y = \partial B_z/\partial y$) and a z gradient field ($G_z = \partial B_z/\partial z$). Therein, $B_z$ is the magnetic field of the apparatus which is oriented in the z direction in the measuring volume. In this known apparatus the z gradient field is generated by means of a z channel which consists of a respective gradient amplifier; the gradient coil for the z gradient field is connected to the output of said amplifier. A z gradient signal which represents the z gradient field to be generated is applied to the input of the z channel.

The x gradient field and the y gradient field are generated by means of a number of channels (for example, four), each of which also consists of a respective gradient amplifier associated with the relevant channel; the associated gradient coils are connected to the outputs thereof. In an embodiment of this known gradient system one channel is intended to receive an x gradient signal which represents the x gradient field to be generated whereas another channel is intended to receive a y gradient signal which represents the y gradient field to be generated and two channels are intended to receive respective gradient signals which form a mix of the x gradient signal and the y gradient signal.

Said mix of the x gradient signal and the y gradient signal is obtained from a conversion unit which includes four outputs which are connected to the four signal inputs of the four gradient amplifiers in a one-to-one association. The conversion unit includes three inputs for receiving L=3 gradient signals, that is, the x gradient signal, the y gradient signal and the z gradient signal which represent the x gradient field, the y gradient field and the z gradient field to be generated, respectively. The conversion algorithm stored in the conversion unit thus converts the incoming x gradient signal and the incoming y gradient signal into said four signals, that is, one for each channel. Thus, in this embodiment the combination of x and y gradient fields is generated by means of four channels. This known configuration aims to enable inter alia a simpler structure of the gradient coils and easier impedance matching.

It is an object of the invention to provide a magnetic resonance imaging apparatus wherein the gradient system can be operated in a more flexible manner, that is, such that the operation of the apparatus can be optimized in respect of a parameter that can be freely chosen by the user.

To this end, the magnetic resonance imaging apparatus according to the invention is characterized in that
- the conversion unit is provided with N inputs, the other N−L inputs of which are arranged to receive N−L other signals which can be chosen independently of the gradient signals,
- and that the conversion unit is arranged to convert, in conformity with the conversion algorithm stored in the conversion unit and together with the L gradient signals applied to the first L inputs, the N−L other signals applied to the other N−L inputs into N control signals for controlling the N gradient amplifiers.

The number of N inputs of the conversion unit is always larger than the number of L gradient fields to be generated; this means that in addition to the L gradient signals representing the gradient fields to be generated there are N−L inputs whereto additional signals which can be freely chosen can be applied. The choice of these additional signals is determined by the desired optimization which itself is determined, for example, on the basis of a type of image of the MRI apparatus to be selected by the user, for example, fast scanning with a comparatively low resolution or slow scanning with a high resolution.

In an embodiment of the invention the number of other N−L inputs equals N−L=1. This choice already enables a number of desired optimizations; the number of gradient channels can thus be kept as small as possible and the construction of the conversion unit can remain as simple as possible.

The gradient coils in a further embodiment of the invention are similar in shape. In combination with N−L=1, this embodiment offers the advantage that only two types of coil need be manufactured and stored, i.e. a first coil shape and the mirror image thereof.

In another embodiment of the invention said one coil shape is derived by combining a saddle-shaped x gradient coil and a cylindrical z gradient coil in a given ratio $I_x:I_z=1:2\alpha$. This embodiment is based on a circular cylindrical z gradient coil and a conventional, saddle-shaped x gradient coil as are generally known from the state of the art. Said one coil shape is derived from said two conventional coil shapes by mapping them on the same cylindrical surface and applying the same current therethrough. Said one coil shape, i.e. the intended coil, is then obtained by summing, in each point of the common cylindrical surface, the current of the circular cylindrical z gradient coil $I_z$ and the current of the saddle-shaped x gradient coil $I_x$ in the given ratio $I_x:I_z=1:2\alpha$. Thus, this is actually a vectorial addition of the currents wherein one of the currents is first multiplied by a factor $2\alpha$. The value of $\alpha$ may then be equal to ½, so that in that case the currents $I_x$ and $I_z$ can be taken so as to be equal. Generally speaking, a number of desired optimizations can then be selected by a suitable choice of the value of the ratio number $\alpha$.

In another embodiment of the invention the other signal applied to the other input is formed by a signal of constant value, which is preferably equal to zero. The latter embodiment can be used when the desired gradient fields are to be generated with a minimum dissipation of energy. Because the four gradient coils are similar in shape (i.e. identical in respect of shape and dimensions except for the fact that they may be the mirror image of one another), they have the same resistance. For minimum energy dissipation the sum of the squares of the four currents must be minimum. It has been found that this is the case when said other signal has a constant value, notably when it is zero.

In another embodiment of the invention the ratio number α is:

$$\alpha = 0.5\sqrt{(2\beta)},$$

wherein:

β equals $(L_z/L_x)(k^2_x/k^2_z)$, $L_z$ and $L_x$ are the inductance of the standard x gradient coil and the standard z gradient coil, respectively, and $k_x$ and $k_z$ are the proportionality factor between the x gradient field $(\partial B_z/\partial x)$ and the z gradient field on the one side and the current $I_x$ through said x gradient coil and said z gradient coil, respectively, on the other side, so that $I_x = k_x(\partial B_z/\partial x)$ and $I_z = k_z(\partial B_z/\partial z)$.

Because of the given choice of the value of the parameters α and β in combination with the described structure of the gradient system, the degree of freedom thus obtained is used to distribute the total energy stored in the gradient coils uniformly among the associated gradient amplifiers. In the case of a conventional gradient system, that is, a gradient system in which one channel is provided for each of the gradient fields, there are always situations in which only one amplifier delivers the total energy (i.e. in the case where the pure orthogonal gradient fields are to be generated) whereas the remaining amplifiers do not deliver energy. In the present embodiment this "worst case" loading of a single amplifier does not occur as will be described in detail hereinafter with reference to FIG. 3.

In another embodiment of the invention a z gradient field $(\partial B_z/\partial z)$ is generated by means of a cylindrical z gradient coil and an x gradient field $(\partial B_z/\partial x)$ and a y gradient field $(\partial B_z/\partial y)$ are generated by means of at least three further gradient channels with gradient coils which are similar in shape. This embodiment of the invention advantageously utilizes the fact that a cylindrical z gradient coil is usually efficient enough. Said additional degrees of freedom are then used to generate the gradients $G_x = \partial B_z/\partial x$ and $G_y = \partial B_z/\partial y$ with three (non-mirrored) gradient coils which are identical in shape and arranged so as to be rotated through an angle of 120° relative to one another. For this case it can be demonstrated that the gradients $G_x$ and $G_y$ are also efficiently generated.

In another embodiment of the invention an x gradient field $(\partial B_z/\partial x)$, a y gradient field $(\partial B_z/\partial y)$ and a z gradient field $(\partial B_z/\partial z)$ are generated by means of six gradient channels with gradient coils which are similar in shape. This embodiment of the invention utilizes the recognition of the fact that in this case three degrees of freedom are available for optimization. One degree can be used to make the sum of all currents equal to zero whereas the other two can be used to distribute the total energy stored in the gradient system as uniformly as possible among the amplifiers. Moreover, in this situation the gradient system according to the invention can be realized on the basis of a conventional gradient system without necessitating major modifications of the gradient amplifiers. In that case, however, the gradient coils should be given the appearance associated with the invention.

In another embodiment of the invention the number of connection cables between the gradient amplifiers and the gradient coils equals the number of gradient coils. This embodiment utilizes the possibility of optimizing the gradient system in such a manner that the sum of the currents through the gradient coils equals zero. In that case it suffices to use only one connection cable between the gradient amplifier and the associated gradient coil, the other ends of all gradient coils being interconnected in a common node. Because the sum of the currents is zero, no current is drained from the node.

In another version of the invention the number of connection cables between the gradient amplifiers and the gradient coils is one larger than the number of gradient coils. This situation occurs when the sum of the currents is not exactly equal to zero but deviates only slightly from zero. In that case a slight discharge of current occurs from the star point, so that it suffices to utilize only one discharge cable of small dimensions to an amplifier stage which is also of small dimensions.

The invention will be described in detail hereinafter with reference to the Figures wherein corresponding reference numerals denote corresponding elements. Therein:

GENERAL BACKGROUND OF THE EMBODIMENTS

Figure 1:
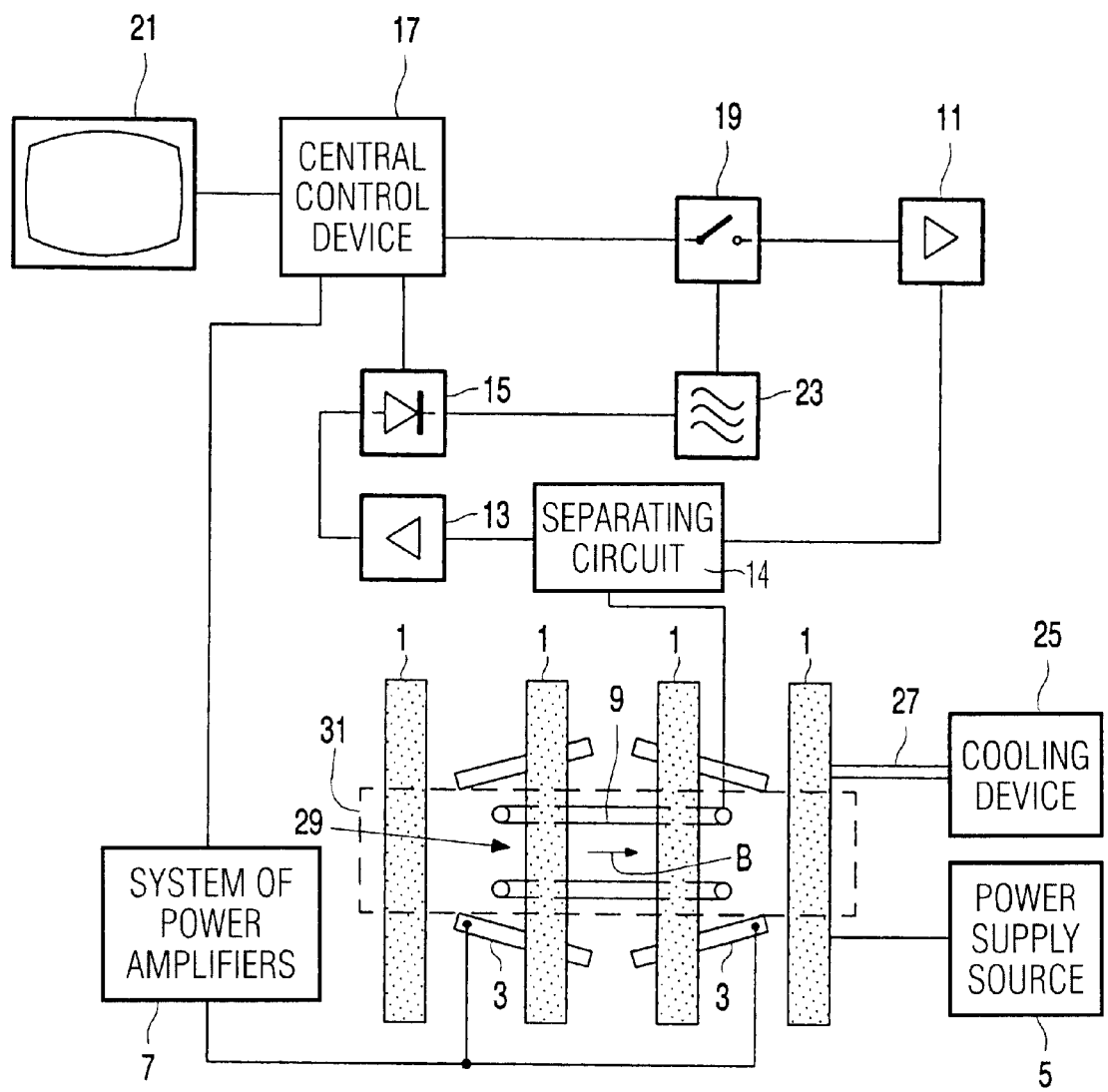
FIG. 1 illustrates diagrammatically the general construction of a magnetic resonance apparatus according to the general state of the art.

The software in an MRI apparatus generates the desired gradient signals $G_x$, $G_y$ and $G_z$, where $G_x = \partial B_z/\partial x$, $G_y = \partial B_z/\partial y$ and $G_z = \partial B_z/\partial z$. In a conventional MRI system according to the general state of the art these three gradient signals are coupled directly to the currents $I_x$, $I_y$ and $I_z$ in the three gradient coils as follows:

$$\begin{pmatrix} G_X \\ G_Y \\ G_Z \end{pmatrix} = \begin{pmatrix} k_x & 0 & 0 \\ 0 & k_y & 0 \\ 0 & 0 & k_z \end{pmatrix} \begin{pmatrix} I_x \\ I_y \\ I_z \end{pmatrix} \quad (1)$$

wherein $k_x$, $k_y$ and $k_z$ are the coil constants of the x channel, the y channel and the z channel, respectively. By matrix inversion the above expression (1) can be written as:

$$\begin{pmatrix} I_x \\ I_y \\ I_z \end{pmatrix} = \begin{pmatrix} \frac{1}{k_x} & 0 & 0 \\ 0 & \frac{1}{k_y} & 0 \\ 0 & 0 & \frac{1}{k_z} \end{pmatrix} \begin{pmatrix} G_X \\ G_Y \\ G_Z \end{pmatrix} \quad (2)$$

For the above expressions (1) and (2) it has been assumed that no eddy current compensation takes place; such eddy current compensation is not of essential importance to the present invention. According to the invention there is provided a number of gradient channels which is larger than the number of gradient fields $G_x$, $G_y$ and $G_x$ to be generated, so that the following expression holds instead of the expression (1):

$$\begin{pmatrix} G_X \\ G_Y \\ G_Z \end{pmatrix} = \begin{pmatrix} k_{x1} & k_{x2} & \ldots & k_{xn} \\ k_{y1} & k_{y2} & \ldots & k_{yn} \\ k_{z1} & k_{z2} & \ldots & k_{zn} \end{pmatrix} \begin{pmatrix} I_1 \\ I_2 \\ \vdots \\ I_N \end{pmatrix} \quad (3)$$

The extension in conformity with the expression (3) creates more possibilities for forming the same desired gradient fields $G_x$, $G_y$ and $G_z$. The solution of the expression (3) required for this purpose can be represented in general as:

$$\begin{pmatrix} I_x \\ I_y \\ I_z \end{pmatrix} = \begin{pmatrix} a_{1x} & a_{1y} & a_{1z} \\ a_{2x} & a_{2y} & a_{2z} \\ \vdots & \vdots & \vdots \\ a_{nx} & a_{ny} & a_{nz} \end{pmatrix} \begin{pmatrix} G_X \\ G_Y \\ G_Z \end{pmatrix} + \begin{pmatrix} b_{11} & \ldots & b_{1,n-3} \\ b_{11} & \ldots & b_{2,n-3} \\ \vdots & \vdots & \vdots \\ b_{n1} & \ldots & b_{n,n-3} \end{pmatrix} \begin{pmatrix} \lambda_1 \\ \vdots \\ \lambda_{n-3} \end{pmatrix} \quad (4)$$

Therein, $\lambda_1 \ldots \lambda_{n-3}$ are (time-dependent) quantities which can be chosen at random and have no effect on the gradient fields to be generated. Via the currents, however, these quantities $\lambda_1 \ldots \lambda_{n-3}$ do have an effect on the distribution of the total power among the n gradient amplifiers, on the total dissipation in the gradient system, and on the sum of the currents; thus, in the case of a sum equal to zero (or a comparatively small sum) it is possible to use a less expensive construction of the gradient amplifiers and/or the wiring connected thereto.

As regards the matrix $a_{ij}$ the following can be written:

$$\begin{pmatrix} k_{x1} & k_{x2} & \ldots & k_{xn} \\ k_{y1} & k_{y2} & \ldots & k_{yn} \\ k_{z1} & k_{z2} & \ldots & k_{zn} \end{pmatrix} \begin{pmatrix} a_{1x} & a_{1y} & a_{1z} \\ a_{2x} & a_{2y} & a_{2z} \\ \vdots & \vdots & \vdots \\ a_{nx} & a_{ny} & a_{nz} \end{pmatrix} = \begin{pmatrix} 1 & 0 & 0 \\ 0 & 1 & 0 \\ 0 & 0 & 1 \end{pmatrix} \quad (5)$$

For this matrix $a_{ij}$ the generalized inverse of the matrix $k_{ij}$ can be chosen. The following relation also holds for the matrix $b_{ij}$:

$$\begin{pmatrix} k_{x1} & k_{x2} & \ldots & k_{xn} \\ k_{y1} & k_{y2} & \ldots & k_{yn} \\ k_{z1} & k_{z2} & \ldots & k_{zn} \end{pmatrix} \begin{pmatrix} b_{11} & \ldots & b_{1,n-3} \\ b_{21} & \ldots & b_{2,n-3} \\ \vdots & \vdots & \vdots \\ b_{n1} & \ldots & b_{n,n-3} \end{pmatrix} = \begin{pmatrix} 0 & \ldots & 0 \\ 0 & \ldots & 0 \\ 0 & \ldots & 0 \end{pmatrix} \quad (6)$$

DESCRIPTION OF THE EMBODIMENTS

The magnetic resonance imaging apparatus which is diagrammatically shown in FIG. 1 includes a first magnet system 1 for generating a steady magnetic field B, a second magnet system 3 (the gradient coil system) for generating magnetic gradient fields, a system of power amplifiers 7 for the gradient coil system 3, and a power supply source for the first magnet system 1. An RF coil 9 serves to generate an RF magnetic alternating field; to this end, it is connected to an RF transmitter device which includes an RF source 11. The RF coil 9 can also be used for the detection of spin resonance signals generated by the RF transmitter field in an object to be examined (not shown); to this end, this coil is connected to an RF receiving device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for image display. The central control device 17 also controls the selection and the shape of the gradient fields $G_x$, $G_y$ and $G_z$ to be generated and also produces any further signals required so as to create said gradient fields. An RF oscillator 23 controls the modulator 19 as well as the detector 15 which processes measuring signals. A cooling device with cooling ducts 27 is provided for the cooling of the magnet coils of the first magnet system 1. The RF coil 9, being arranged within the magnet systems 1 and 3, encloses a measuring space 29 which is spacious enough to enclose a patient to be examined, or a part of a patient to be examined, for example the head and the neck, in the case of an apparatus for medical diagnostic measurements. Thus, a steady magnetic field B, gradient fields for selecting object slices, and a spatially uniform RF alternating field can be generated in the measuring space 29. The RF coil 9 can combine the functions of transmitter coil and measuring coil; in that case there is provided a separating circuit 14 for separating the forward and the return signal traffic. It is also possible to use different coils for the two functions, for example surface coils then acting as measuring coils. The coil 9 can be surrounded, if desired, by an RF field shielding Faraday cage 31. The overall gradient system is thus formed by the combination of the central control device 17, the gradient coil system 3 and the system of power amplifiers 7.

Figure 2A:
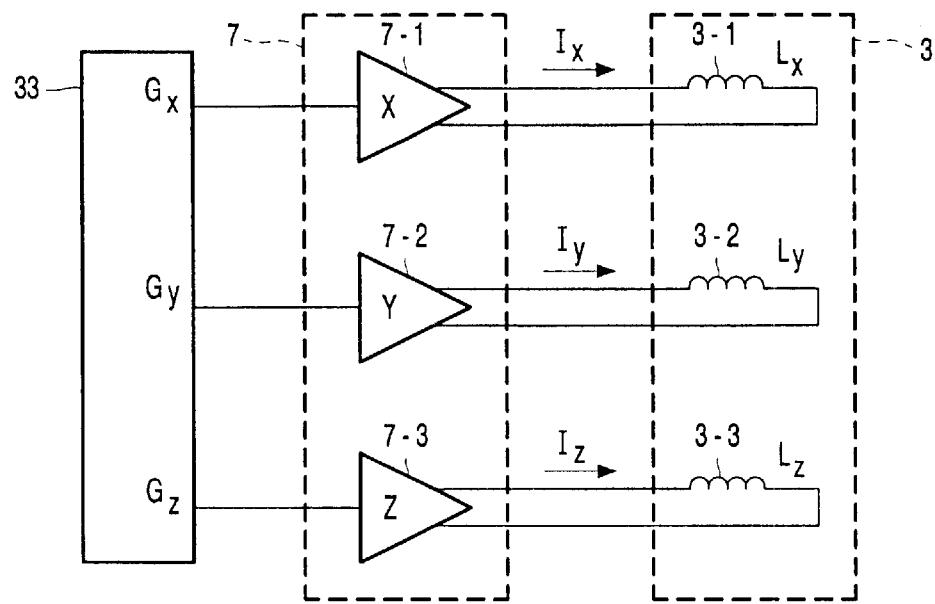
FIG. 2a shows diagrammatically a gradient system according to the general state of the art.
Figure 2B:
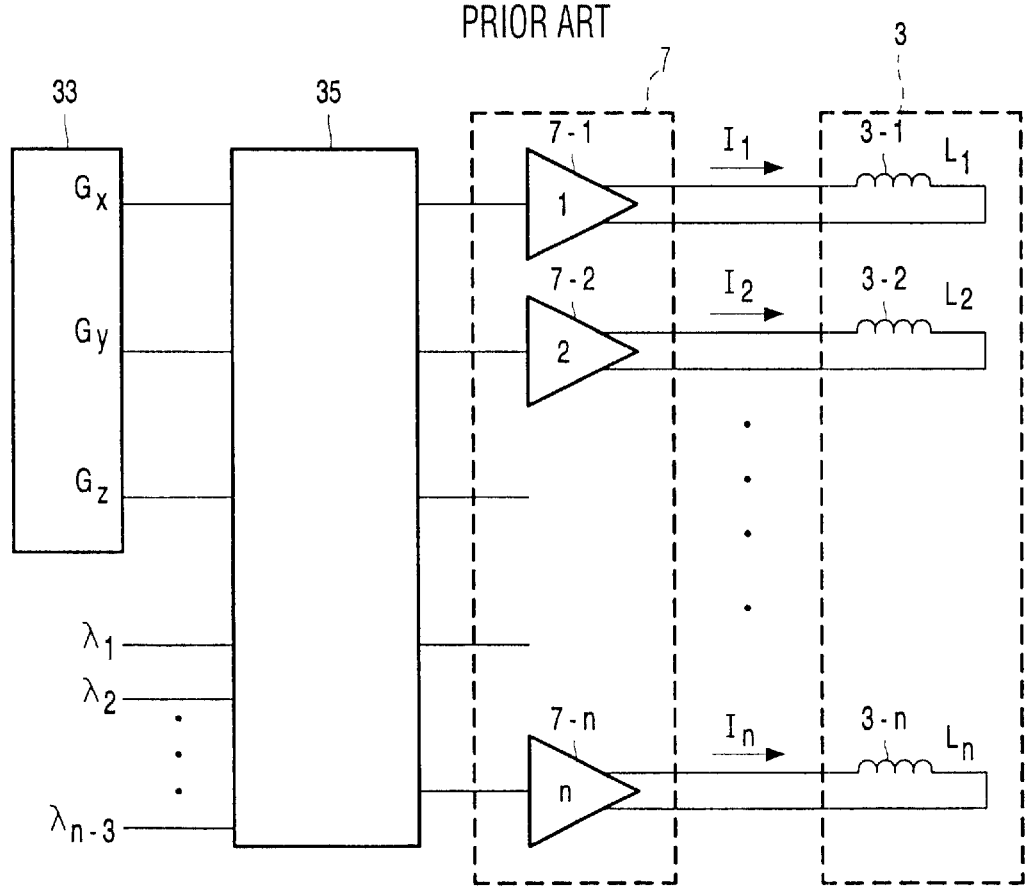
FIG. 2b shows diagrammatically a gradient system according to the invention.

FIG. 2 illustrates the difference between a gradient system according to the present state of the art (FIG. 2a) and a gradient system according to the invention (FIG. 2b). In FIG. 2a the gradient signals $G_x$, $G_y$ and $G_z$ are produced by a scan control unit 33 which forms part of the central control device 17. Each of these gradient signals $G_x$, $G_y$ and $G_z$ is applied to associated power amplifiers (gradient amplifiers) 7-1, 7-2 and 7-3, respectively, which form part of the system of power amplifiers 7 shown in FIG. 1. An associated gradient coil 3-1, 3-2 and 3-3 is connected to each of the gradient amplifiers, that is, one for each of the co-ordinate directions x, y and z. The combinations of each time a gradient amplifier and a gradient coil thus constitute a system of three channels for generating the three desired gradient fields.

Like in FIG. 2a, in FIG. 2b the L (L=3) gradient signals $G_x$, $G_y$ and $G_z$ are produced by a scan control unit 33 which forms part of the central control device 17. Furthermore, the scan control unit 33 produces further N–L further signals $\lambda_1 \ldots, \lambda_{n-3}$ whose appearance is dependent on the desired application of the MRI apparatus. The gradient signals $G_x$, $G_y$ and $G_z$ and the signals $\lambda_1, \ldots, \lambda_{n-3}$ are applied to a conversion unit 35 which derives a number of signals $I_1, \ldots, I_n$ from the signals applied thereto. The conversion unit 35 converts the N signals $G_x$, $G_y$, $G_z$, $\lambda_1, \ldots, \lambda_{n-3}$ applied thereto in conformity with a conversion algorithm, stored in the conversion unit, so as to form N control signals $I_1, \ldots, I_n$ for controlling the N gradient amplifiers 7-1, ..., 7-n. An associated gradient coil 3-1, ..., 3-n is connected to each of said gradient amplifiers, so that a gradient field can be generated for each of the co-ordinate directions x, y and z. Said combinations of each time a gradient amplifier and a gradient coil thus constitute a system of n channels for generating the three desired gradient fields.

Figure 3:
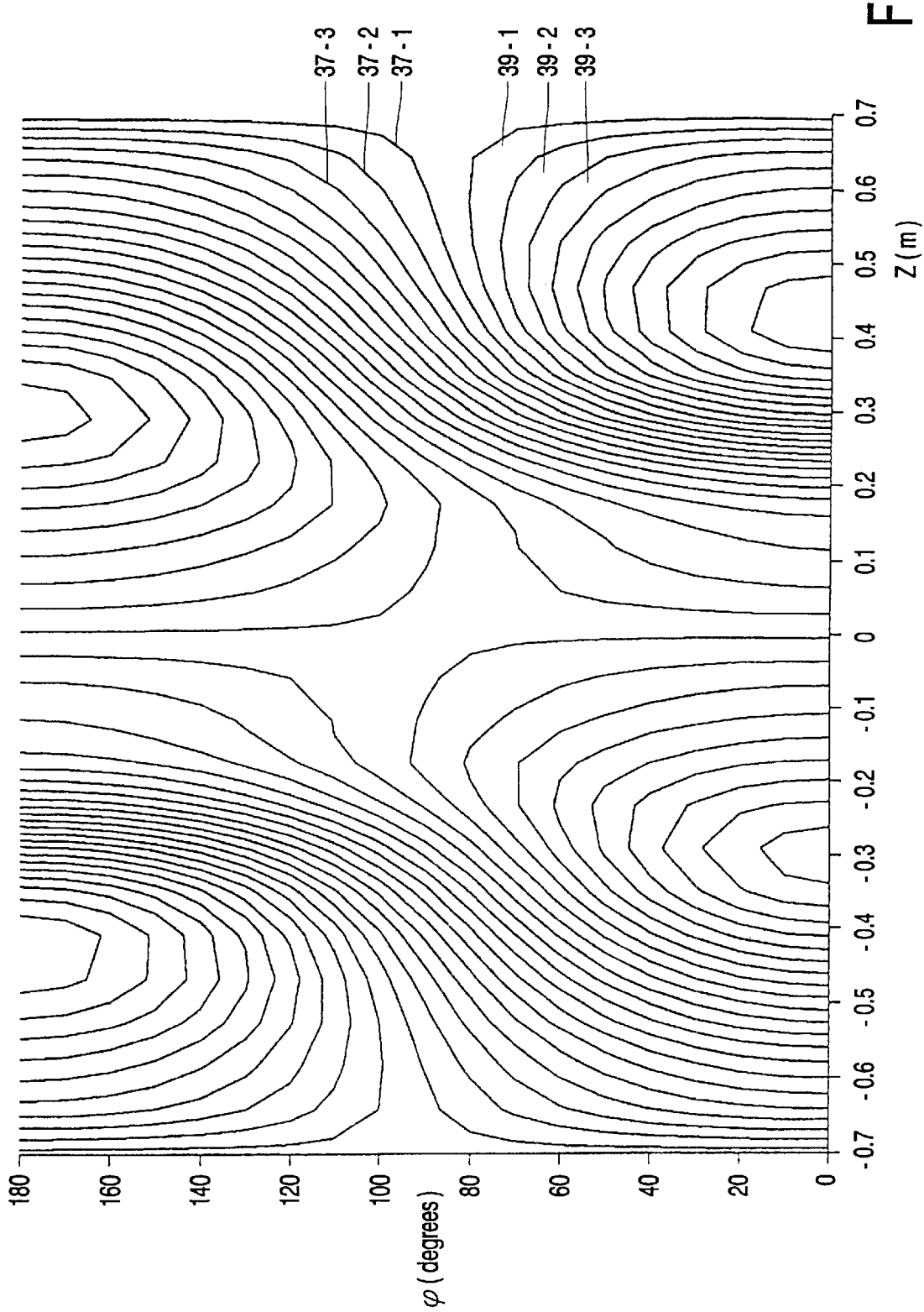
FIG. 3 shows a conductor pattern for use in gradient coils in a gradient system with N=4 channels and gradient coils which are similar in shape.

FIG. 3 shows a conductor pattern for use in gradient coils in a gradient system with N=4 channels for generating N=3 gradient fields and with gradient coils which are similar in shape. The design of this conductor pattern is based on the combination of a cylindrical conductor pattern as conventionally used for generating a z gradient field and a saddle-shaped conductor pattern as conventionally used for generating an x gradient field or a y gradient field. The conductor pattern to be formed from these basic patterns lies on a cylindrical surface. In each point of this surface the individual currents $I_x$ and $I_z$ of each of the basic patterns are summed with a given weighting factor 1:2α, so that: $I_x:I_z$= 1:2α. In the conductor pattern shown in FIG. 3 the value of 2α is chosen to be equal to 1, so that the currents $I_x$ and $I_z$ are equal. It is to be noted that the construction of the conductor pattern according to the above description applies to two non-shielded gradient coils. However, it is simply possible to apply this idea to an actively shielded system of gradient coils, that is, a system in which the field generating coils are situated on a cylinder having a first diameter, whereas the coils shielding the space outside the coils from the gradient fields are situated on a cylinder having a second, larger diameter. In that case the actual gradient coil is constructed in the same way as described above; the assembly of the shielding coil is then performed in the same way as described above, based on the x shielding coil and the y shielding coil which have to be assembled with the same ratio as the actual gradient coils (so in this case 2α equal to 1).

The parameter β (being defined in conformity with $\beta=(L_z/L_x)(k^2_x/k^2_z)$ as previously mentioned) constitutes a measure of the ratio of the energies stored in the saddle-shaped x gradient coil and in the cylindrical z gradient coil, said (imaginary) coil shapes acting as the starting point for the formation of said actual coil which is obtained by assembly of the two said x and z gradient coils. The latter parameter is not easy to influence during the design process, because it follows from the properties of the constituent x and z gradient coils. The parameter α, however, determining the individual weight of the components upon assembly, can be chosen at random within given limits. It can be demonstrated that the energy stored in the (actual) coils is distributed among the driving amplifiers with a maximum uniformity if: α=0.5√(2β). The signal applied to the other input of the conversion unit must then be chosen to be such that it is compatible with the situation of maximum uniformity of the distribution between the gradient amplifiers of the energy stored in the gradient coils. Said signal is determined on the basis of the following considerations. Generally speaking, the energy $E_i$ to be delivered per gradient amplifier i is given by the expression:

$$E_i = \frac{1}{2} I_i \sum_{j=1}^{j=N} \left( \frac{k_{xi} k_{xj}}{k_x^2} L_x^2 + \frac{k_{yi} k_{yj}}{k_y^2} L_y^2 + \frac{k_{zi} k_{zj}}{k_z^2} L_z^2 \right) I_j \quad (7)$$

wherein $I_i$ is the current in the channel i, $k_x$, $k_y$ and $k_z$ are the coil constants of the conventional gradient coils, and $k_{xi}$, $k_{yi}$ and $k_{zi}$ are the coil constants of the gradient coils formed with the parameters α and β. The expression (7) can also be written as follows:

$$E_i = \frac{1}{2} I_i \left( \frac{k_{xi}}{k_x^2} L_x G_x + \frac{k_{yi}}{k_y^2} L_y G_y + \frac{k_{zi}}{k_z^2} L_z G_{xz} \right) \quad (8)$$

It is assumed that a given configuration of gradient coils has been selected, thus fixing the value of the parameters α and β. In the case of one degree of freedom (so one other input of the conversion unit) and a current ratio $I_x:I_z$=1:2α, the following holds for the relationship between the gradients $G_x$, $G_y$ and $G_z$ on the one hand and the currents $I_1$, $I_2$, $I_3$ and $I_4$ in the four channels on the other hand:

$$\begin{pmatrix} G_X \\ G_Y \\ G_Z \end{pmatrix} = k_x \begin{pmatrix} \frac{1}{2} & \frac{1}{2} & 0 & 0 \\ 0 & 0 & \frac{1}{2} & \frac{1}{2} \\ \frac{1}{4\alpha} & -\frac{1}{4\alpha} & \frac{1}{4\alpha} & -\frac{1}{4\alpha} \end{pmatrix} \begin{pmatrix} I_1 \\ I_2 \\ I_3 \\ I_4 \end{pmatrix} \quad (9)$$

wherefrom it follows for $I_1$, $I_2$, $I_3$ and $I_4$ that:

$$\begin{pmatrix} I_1 \\ I_2 \\ I_3 \\ I_4 \end{pmatrix} = \frac{1}{k_x} \begin{pmatrix} 1 & 0 & \alpha \\ 1 & 0 & -\alpha \\ 0 & 1 & \alpha \\ 0 & 1 & -\alpha \end{pmatrix} \begin{pmatrix} G_x \\ G_y \\ G_z \end{pmatrix} + \frac{\lambda}{k_x} \begin{pmatrix} 1 \\ -1 \\ -1 \\ 1 \end{pmatrix} \quad (10)$$

The energy per amplifier i as a function of the quantities β, α, $G_x$, $G_y$ and $G_z$ is obtained by substituting the expression (10) and the expression $\beta=(L_z/L_x)(k^2_x/k^2_z)$ in the expression (8).

The signal λ on the other input of the conversion unit can be determined as follows. It is assumed that the shape of the gradient coils has been selected, that is, that the previously mentioned parameters α and β are known as a numerical value, like the inductances L and the proportionality factors k of the coils in the gradient coil system. Furthermore, it is known which x, y and z gradient fields are desired; the quantities $G_x$, $G_y$ and $G_z$ (as functions of time), therefore, are also known. The process of determining the quantity λ at a given instant commences by assuming an arbitrary initial value for λ; for example λ=0. Using these quantities, the various gradient currents Is can be calculated; in this respect see, for example, the expression (10) in which only said quantities occur. Using these calculated currents $I_i$, an average person skilled in the art can readily determine the various energies $E_i$ stored in each of the gradient channels. Subsequently, the maximum value of said energies $E_i$ must be determined; this value is symbolically denoted by the reference M=$\max_i(E_i)$. Subsequently, the value of λ is varied (for example, in steps of 0.1) and the value of M is determined again; this value need not belong to the same energy as for the previous value of λ. Upon variation of λ over an interval of λ values, a minimum value of M is found; this minimum value is symbolically denoted by the reference $\min_\lambda(\max_i(E_i))$. Said minimum value of M occurs for a given value of λ which is called the optimum value $\lambda_{opt}$ of λ. The entire process for determining $\lambda_{opt}$ is then repeated for all relevant values of time, so that ultimately $\lambda_{opt}(t)$ is known as a function of time.

The described method of determining λ is also suitable for carrying out other optimization processes. The method then required deviates from the described method only in that the quantity to be optimized, being determined in dependence on the calculated currents $I_i$, is different. Generally speaking, this is always possible because all quantities in the gradient system are fixed in principle when the coil shapes and the situation of the coils are fixed and the currents $I_i$ as a function of time are known.

In some special cases it is not necessary to adhere to the described algorithm for determining λ; this has already been found for the case of minimum dissipation with four gradient coils where the other signal applied to the other input of the conversion unit is formed by a signal of constant value. Another example in which said other signal can be determined more directly will be described with reference to the FIGS. 4a and 4b.

Using the conductor pattern shown in FIG. 3 a coil can be realized by mirroring the pattern of FIG. 3 relative to the line φ=180° and by imagining the pattern thus formed to be rolled up so as to form a circular cylinder whose cylinder axis extends parallel to said line φ=180°. The physical coil is then formed by making saw cuts in a conductor plate of, for example copper (which can be assumed to be situated in the plane of drawing) at the area of the lines such as 37-1, 37-2, 37-3, thus forming a conductor pattern with conductors in the form of a "fingerprint" with conductors such as 39-1, 39-2, 39-3 etc. Thus, the above choice of the parameters α and β enables a system of gradient coils to be realized in which the coils are of a similar shape and in which the power stored in the gradient coils is very uniformly distributed among the driving gradient amplifiers.

The above expression (10) has been derived while assuming that a total of N−4 signals is applied to the inputs of the conversion unit 35 in order to form L=3 gradient fields, so N−L=1, and that the shape of the gradient coils is similar. Thus, no assumption has been made as regards the value of the parameters λ and β or the relation therebetween. The one degree of freedom λ occurring in this case can be used to generate the desired gradient fields with a minimum dissipation. Because the four gradient coils are of similar shape, and hence have the same electrical resistance, the sum of the squares of $I_1$ to $I_4$ must be minimized for this purpose. In these circumstances this minimum is reached for λ=0. When λ is thus chosen, $G_x$ is generated by $I_1$ and $I_2$, whereas $G_y$ is generated by $I_3$ and $I_4$ and all currents are 0used in the ratio $I_1=-I_2=I_3=-I_4$ so as to generate $G_z$.

Figure 4A:
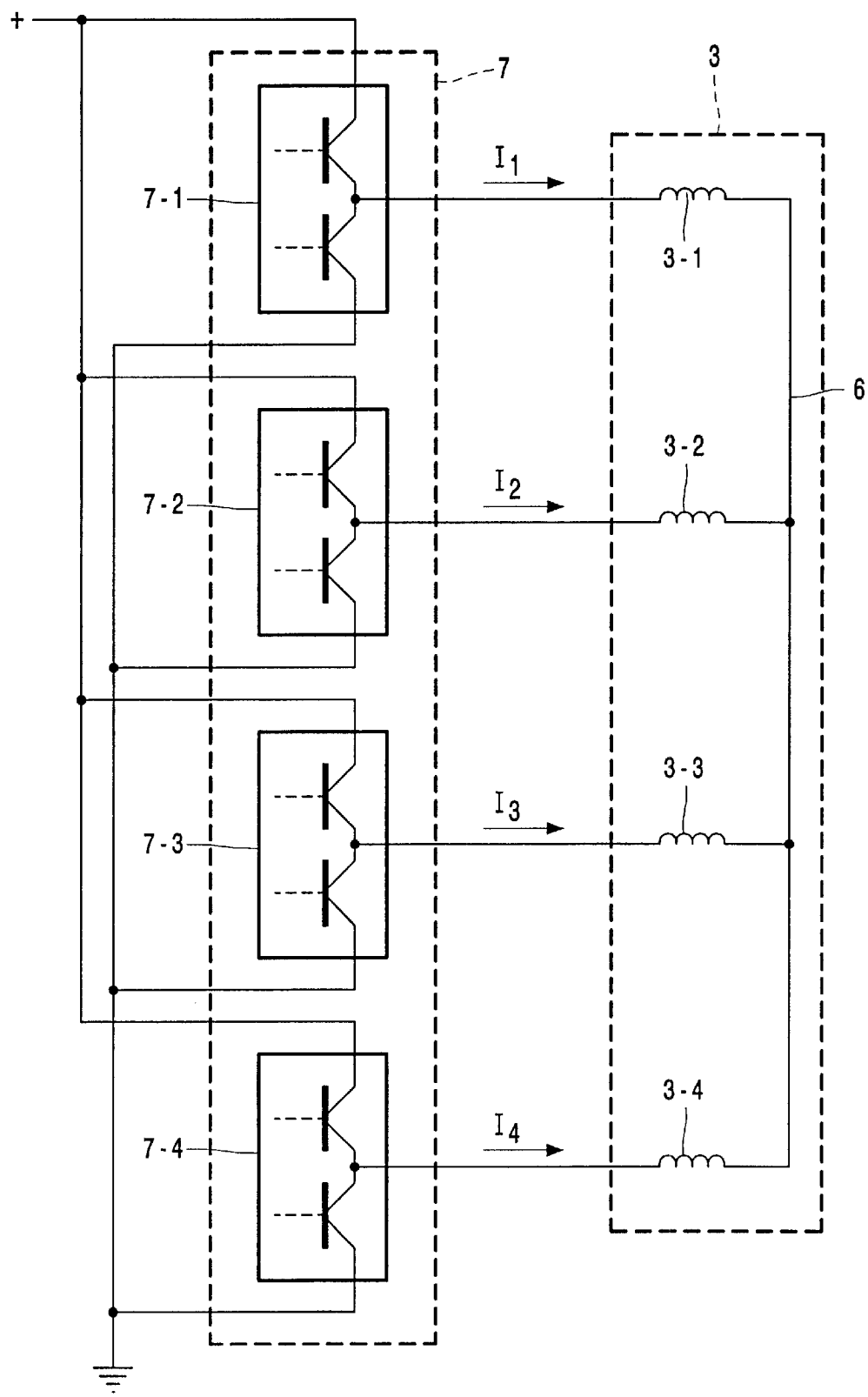
FIG. 4a shows an embodiment of the invention in which the sum of the gradient currents is made exactly equal to zero.
Figure 4B:
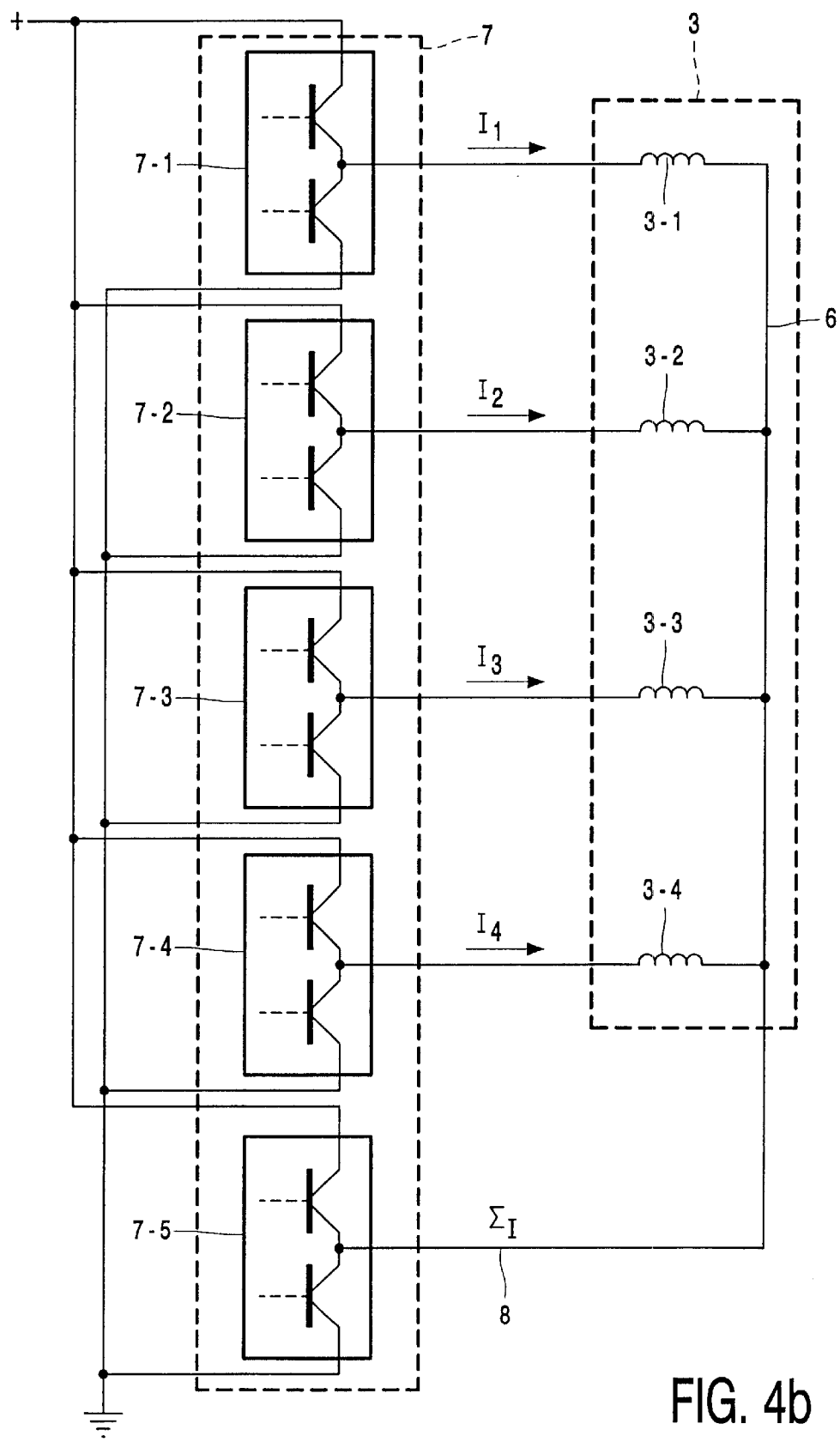
FIG. 4b shows an embodiment of the invention wherein the sum of the gradient currents exhibits only a small deviation from zero.

The FIGS. 4a and 4b show an embodiment of the invention in which the sum of the currents is made exactly equal to zero (FIG. 4a) or deviates only slightly therefrom (FIG. 4b). In FIG. 4a each gradient coil 3-i is driven at one side by a so-called half bridge 7-i, the other end being connected to a common node 6 of gradient coils. This situation is used when the sum of the currents flowing through the gradient coils is zero; an advantage is thus achieved in that it is not necessary to use a fifth gradient amplifier or a fifth power cable, resulting in a considerable cost saving. (It is to be noted that gradient currents may be as strong as a few hundreds of amperes and are accompanied by very short switching time s; severe requirements are thus imposed on the gradient amplifiers and the power supply cables.) It may also occur that this sum deviates slightly from zero due to small disturbances; in that case a return line 8 may be inserted between the node 6 and a common reference point (see FIG. 4b). In the latter case a considerable advantage is still realized in that the return current is significantly smaller than the individual currents through the gradient coil. In the embodiment of the invention which is shown in these Figures the gradient fields are generated by means of a cylindrical (so conventional) z gradient coil and the additional degrees of freedom can be used by generating $G_x$ and $G_y$ by means of three gradient channels with similar gradient coils. These coils are then arranged on a common axis at angles of 120° relative to one another. When one of the gradient coils forms a gradient field at an angle of 15° relative to, for example a horizontal reference plane, the expression (9) becomes:

$$\begin{pmatrix} G_x \\ G_y \\ G_z \end{pmatrix} = \begin{pmatrix} k_x\cos(15°) & k_x\cos(135°) & k_x\cos(255°) & 0 \\ k_x\sin(15°) & k_x\sin(135°) & k_x\sin(255°) & 0 \\ 0 & 0 & 0 & k_z \end{pmatrix} \begin{pmatrix} I_1 \\ I_2 \\ I_3 \\ I_4 \end{pmatrix} \quad (11)$$

Said other signal λ(t) can be determined on the basis of the following considerations. It is assumed that a given gradient combination $G_x$, $G_y$, $G_z$ is desired. A given combination of currents $I_1, \ldots, I_4$ follows therefrom. In the situation involving a cylindrical z gradient coil and three coils on a common axis at angles of 120° relative to one another in order to generate $G_x$ and $G_y$ (the situation represented by the expression (11)), $G_z$ is generated exclusively by means of the current $I_4$ whereas the other two gradient fields are generated by means of $I_1, \ldots, I_3$. When the currents $I_1, \ldots, I_3$ are increased by an equal amount ΔI, it is known that no change occurs in the gradient fields in that case, because the three coils extend at angles of 120° relative to one another, so that the equal changes per coil cancel one another in space. It then holds that $I_1+Δ+I_2+Δ+I_3+Δ+I_4=0$, so that $Δ=(I_1+I_2+I_3+I_4)/3$. The expression (11) can then be extended as follows:

$$\begin{pmatrix} G_x \\ G_y \\ G_z \\ S \end{pmatrix} = \begin{pmatrix} k_x\cos(15°) & k_x\cos(135°) & k_x\cos(255°) & 0 \\ k_x\sin(15°) & k_x\sin(135°) & k_x\sin(255°) & 0 \\ 0 & 0 & 0 & k_z \\ 1 & 1 & 1 & 1 \end{pmatrix} \begin{pmatrix} I_1 \\ I_2 \\ I_3 \\ I_4 \end{pmatrix} \quad (12)$$

The left term is thus extended to 4 elements, the additional element representing the sum S of the currents; the matrix with the corner values is extended with an additional row which consists of four numbers 1. The expression (12) thus obtained represents a system of four equations with four variables, which system can be solved by means of the value S=0 for S. Thus, the values $I_1, \ldots, I_4$ follow therefrom.

Figure 5:
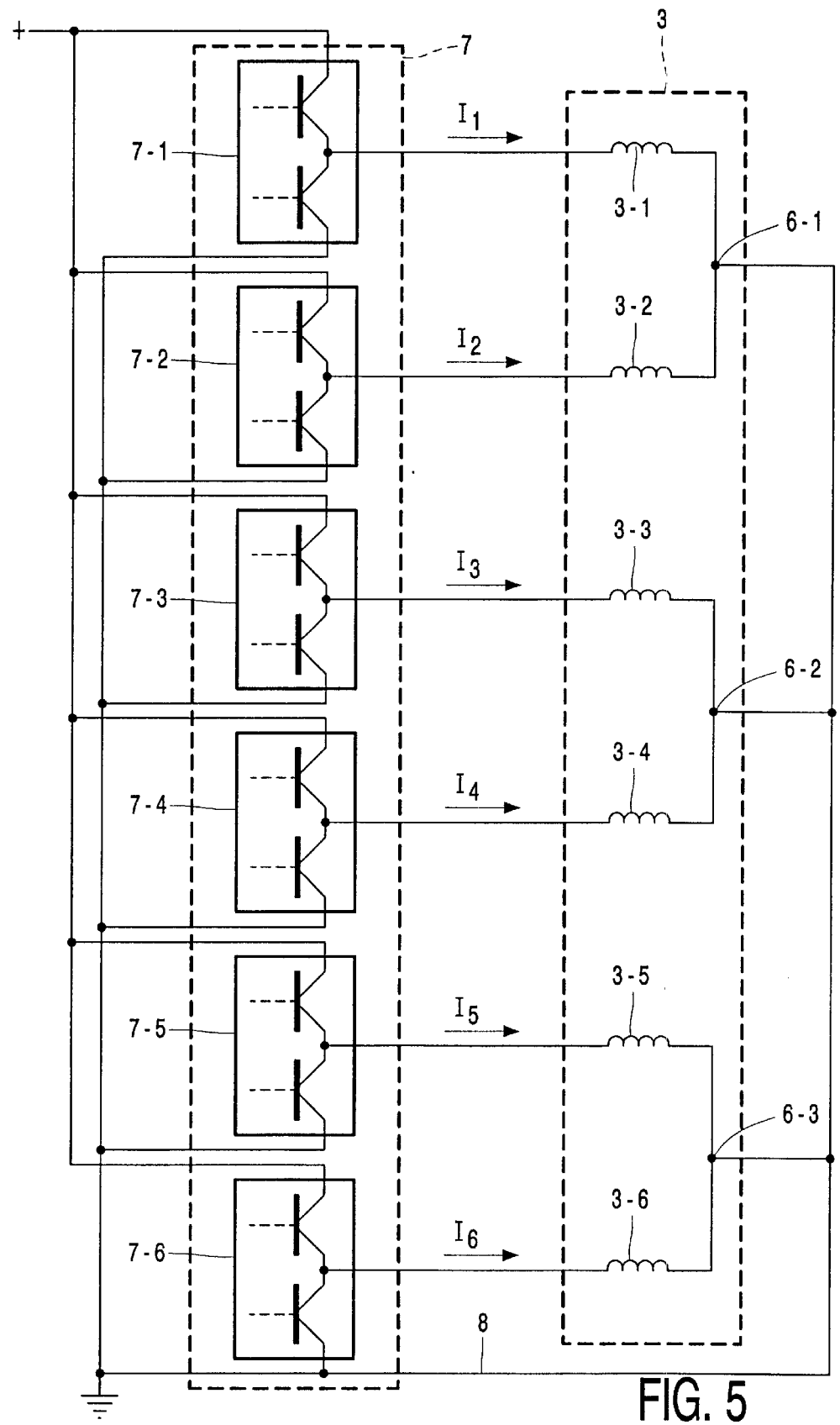
FIG. 5 shows diagrammatically a gradient system according to the invention with N=6 similar gradient channels.

FIG. 5 is a diagrammatic representation of a gradient system according to the invention with N=6 identical gradient channels, each of which consists of a gradient amplifier 7-i and an associated gradient coil 3-i. In this Figure the L (L=3) gradient signals $G_x$, $G_y$ and $G_z$ are produced by a scan control unit which is not shown in this Figure and also produces the N−L=3 further signals $λ_1, λ_2, λ_3$ whose appearance is dependent on the intended application of the MRI apparatus, in this case being the combination of rendering the sum of the currents zero and distributing the total energy stored in the gradient system as uniformly as possible among the amplifiers. The gradient coils should now have the appearance associated with the invention, for example, as described with reference to FIG. 3. The gradient signals $G_x$, $G_y$ and $G_z$ and the signals $λ_1, λ_2$ and $λ_3$ are applied to the conversion unit which derives the signals $I_1, \ldots, I_6$ therefrom in order to control the N gradient amplifiers 7-1, . . . ,7-n in such a manner that a gradient field can be generated for each of the co-ordinate directions x, y and z.

In FIG. 5 all six coils 3-i are driven by a respective amplifier 7-i which in this case consists of a so-called half bridge. Therefore, on the basis of a conventional gradient system (i.e. a gradient system in which one gradient coil and an associated amplifier are provided for each co-ordinate direction) it is now possible to realize the gradient system according to the invention without necessitating significant modifications of the gradient amplifiers. This is because the conventional gradient amplifiers customarily consist of two half bridges, that is, one to one side of the associated gradient coil and the other to the other side of the same gradient coil. Each of these two half bridges can be associated with one of the coils according to the invention, so that six half bridges are used instead of three full H bridges. This is possible because the stored energy is now more uniformly distributed, so that the maximum load of these amplifiers may be lower. If the sum of the currents is to be made equal to zero in the configuration thus formed, a current path must exist between the junctions 6-1, 6-2 and 6-3. If the possibility for a slight deviation of the sum from zero is to be left open, a current path 8 should also exist between the junctions and the common zero voltage.

The two signals $\lambda_1(t)$ and $\lambda_2(t)$ on the other inputs of the conversion unit, ensuring that the total energy stored in the gradient system is distributed as uniformly as possible among the gradient amplifiers, can be determined by means of the method already described with reference to FIG. 3 for the case involving one signal $\lambda(t)$. The value of the signal $\lambda(t)$ for which the sum of the currents in the gradient coils equals zero can be determined by means of a method as already described with reference to the FIGS. 4a and 4b.

The six mutually identical coils are arranged in such a manner that they are rotated through each time 60° relative to one another. Two of the three additional degrees of freedom are now used to generate $G_x$, $G_y$ and $G_z$ with an optimum uniformity of the distribution of the stored total energy among the various gradient channels. It is assumed that each gradient coil has a coil constant $k_z$ in the z direction and a coil constant $k_x$ in the x/y direction. The appearance of the gradient matrix is then as follows:

$$\begin{pmatrix} G_x \\ G_y \\ G_z \end{pmatrix} = \quad (13)$$

$$k_x \begin{pmatrix} 0.966 & 0.259 & -0.707 & -0.966 & -0.259 & 0.707 \\ 0.259 & 0.966 & 0.707 & -0.259 & -0.966 & -0.707 \\ \frac{k_z}{k_x} & \frac{k_z}{k_x} & \frac{k_z}{k_x} & \frac{k_z}{k_x} & \frac{k_z}{k_x} & \frac{k_z}{k_x} \end{pmatrix} \begin{pmatrix} I_1 \\ I_2 \\ I_3 \\ I_4 \\ I_5 \\ I_6 \end{pmatrix}$$

In the latter expression the numerical values in the first row in the matrix represent the cosines of $15°+n.60°$ and in the second row they represent the sines of $15°+n.60°$.

The energy can be distributed among the six amplifiers, the currents being chosen, for example, as follows: for generating $G_z$ alone: $I_1=I_2=I_3=I_4=I_5=I_6$; for generating $G_x$ alone: $I_1=2.16*I_2=\_I_3=\_I_4=\_2.16*I_5=I_6$, and for generating $G_y$ alone: $2.16*I_1=I_2=I_3=\_2.16*I_4=\_I_5=\_I_6$; this is found by inserting these factors for the above currents in the right member of the expression (13), after which the left member reveals that $G_x$ alone, $G_y$ alone, or $G_z$ alone is generated.

What is claimed is:

1. A magnetic resonance apparatus which includes:
    a gradient system for generating L gradient fields in a measuring volume of the apparatus, which gradient system includes a number of N (N>L) mutually independent channels, each of which includes a gradient amplifier, with a signal input and an output and a gradient coil connected to the output of the gradient amplifier, and a conversion unit provided with N outputs which are connected to the N signal inputs of the N gradient amplifiers, respectively and with N inputs in two groupings, a first grouping including L inputs and a second grouping including N–L inputs, wherein the L inputs are arranged to receive L gradient signals representing the gradient fields to be generated, wherein the N–L inputs are arranged to receive N–L other signals which are selectable independently of the gradient signals, and wherein the conversion unit is arranged to convert, in accordance with a conversion algorithm stored in the conversion unit, and at least the L gradient signals applied to the inputs together with the selected N–L other signals applied to the N–L inputs into N control signals for controlling the N gradient amplifiers.

2. A magnetic resonance apparatus as claimed in claim 1, wherein the number of N–L inputs equals N–L=1.

3. A magnetic resonance apparatus as claimed in claim 2, wherein the gradient coils are of a similar shape.

4. A magnetic resonance imaging apparatus as claimed in claim 3, wherein a gradient coil is derived from an assembly of a saddle-shaped x gradient coil and a cylindrical z gradient coil in a given ratio $I_x:I_z=1:2\alpha$.

5. A magnetic resonance imaging apparatus as claimed in claim 4, wherein the other signal applied to the N–L input is formed by a signal of constant value.

6. A magnetic resonance imaging apparatus as claimed in claim 4, wherein the ratio number $\alpha$ is: $\alpha=0.5\sqrt{(2\beta)}$, wherein:

$\beta$ equals $(L_z/L_x)(k^2_x/k^2_z)$,
   $L_z$ and $L_x$ are the inductance of the standard x gradient coil and the standard z gradient coil, respectively, and
   $k_x$ and $k_z$ are the proportionality factor between the x gradient field ($\partial B_z/\partial x$) and the z gradient field on the one side and the current $I_x$ through said x gradient coil and said z gradient coil, respectively, on the other side, so that $I_x=k_x(\partial B_z/\partial x)$ and $I_z=k_z(\partial B_z/\partial z)$.

7. A magnetic resonance apparatus as claimed in claim 1, wherein a z gradient field ($\partial B_z/\partial z$) is generated by means of a cylindrical z gradient coil and an x gradient field ($\partial B_z/\partial x$) and a y gradient field ($\partial B_z/\partial y$) are generated by means of at least three further gradient channels with gradient coils which are of a similar shape.

8. A magnetic resonance apparatus as claimed in claim 1, wherein an x gradient field ($\partial B_z/\partial x$), a y gradient field ($\partial B_z/\partial y$) and a z gradient field ($\partial B_z/\partial z$) are generated by means of six gradient channels with similar gradient coils.

9. A magnetic resonance imaging apparatus as claimed in claim 1, wherein the number of connection cables between the gradient amplifiers and the gradient coils equals the number of gradient coils.

10. A magnetic resonance imaging apparatus as claimed in claim 1, wherein the number of connection cables between the gradient amplifiers and the gradient coils is N+1.

* * * * *